United States Patent
Yoshikawa et al.

(10) Patent No.: US 10,950,931 B2
(45) Date of Patent: Mar. 16, 2021

(54) WIRELESS COMMUNICATION DEVICE

(71) Applicant: PANASONIC INTELLECTUAL PROPERTY MANAGEMENT CO., LTD., Osaka (JP)

(72) Inventors: Yoshishige Yoshikawa, Shiga (JP); Takashi Watanabe, Nara (JP); Shota Teramoto, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/345,450

(22) PCT Filed: Jan. 23, 2018

(86) PCT No.: PCT/JP2018/001856
§ 371 (c)(1),
(2) Date: Apr. 26, 2019

(87) PCT Pub. No.: WO2018/142995
PCT Pub. Date: Aug. 9, 2018

(65) Prior Publication Data
US 2019/0252769 A1  Aug. 15, 2019

(30) Foreign Application Priority Data
Jan. 31, 2017  (JP) .............................. JP2017-015543

(51) Int. Cl.
*H01Q 1/50* (2006.01)
*H01Q 1/24* (2006.01)
(Continued)

(52) U.S. Cl.
CPC ................. *H01Q 1/50* (2013.01); *H01Q 1/24* (2013.01); *H01Q 3/24* (2013.01); *H01Q 3/247* (2013.01);
(Continued)

(58) Field of Classification Search
CPC .. H01Q 1/2233; H01Q 21/0006; H01Q 21/24; H01Q 21/29; H01Q 21/293
See application file for complete search history.

(56) References Cited

U.S. PATENT DOCUMENTS 6,181,294 B1 * 1/2001 Porter .................... G01D 4/004
343/859
6,924,766 B2  8/2005 Tran
(Continued)

FOREIGN PATENT DOCUMENTS

EP  2876821 A1 * 5/2015 ........... H01Q 1/2233
JE  2009-253788 A  10/2009
(Continued)

OTHER PUBLICATIONS

International Search Report and Written Opinion issued in International Patent Application No. PCT/JP2018/001856, dated Apr. 10, 2018; with partial English translation.
(Continued)

*Primary Examiner* — Daniel Munoz
(74) *Attorney, Agent, or Firm* — McDermott Will & Emery LLP

(57) ABSTRACT

A wireless communication device of the present disclosure, to which an electric power measurement value is input that is measured in an electric power measurer to which a power supply side power line and a load side power line are connected, includes a first antenna element that transmits and receives radio waves and a wireless circuit connected to the first antenna element. The first antenna element has a longitudinal side perpendicular to a line along which the power supply side power line and the load side power line extend.

4 Claims, 5 Drawing Sheets

(51) Int. Cl.
*H04B 1/40* (2015.01)
*H04B 7/10* (2017.01)
*H01Q 3/24* (2006.01)
*H04B 1/38* (2015.01)
*H04B 1/04* (2006.01)
*H04B 1/18* (2006.01)

(52) U.S. Cl.
CPC ............ *H04B 1/0458* (2013.01); *H04B 1/18* (2013.01); *H04B 1/38* (2013.01); *H04B 1/40* (2013.01); *H04B 7/10* (2013.01)

(56) References Cited

U.S. PATENT DOCUMENTS

| | | |
|---|---|---|
| 2015/0192625 A1 | 7/2015 | Sato |
| 2017/0003331 A1 | 1/2017 | Sato |
| 2019/0190164 A1* | 6/2019 | Yoshikawa ............ G08C 17/02 |

FOREIGN PATENT DOCUMENTS

| | | |
|---|---|---|
| JP | 2002-109672 A | 4/2002 |
| JP | 2011-081518 A | 4/2011 |
| JP | 2014-064132 A | 4/2014 |
| JP | 2015-129647 A | 7/2015 |

OTHER PUBLICATIONS

Extended European Search Report dated Dec. 10, 2019 for the related European Patent Application No. 18748233.6.

* cited by examiner

WIRELESS COMMUNICATION DEVICE

CROSS-REFERENCE OF RELATED APPLICATIONS

This application is the U.S. National Phase under 35 U.S.C. § 371 of International Patent Application No. PCT/JP2018/001856, filed on Jan. 23, 2018, which in turn claims the benefit of Japanese Application No. 2017-015543, filed on Jan. 31, 2017, the entire disclosures of which Applications are incorporated by reference herein.

TECHNICAL FIELD

The present disclosure relates to a wireless communication device incorporated in an electricity meter so as to have a wireless communication function.

BACKGROUND ART

An electricity meter is used for measuring consumption of electricity for household and industry. While a conventional electricity meter has a single function of just measuring and displaying an amount of electric power, in recent years, an electricity meter including a communication function is becoming the mainstream. This is because, in view of energy conservation and environmental protection, it is necessary to manage electricity consumption by energy management, and an energy management system is constructed in which measurement data of electricity meters are transmitted to and collected in a management server in real time. As a communication method to be mounted in the meter, there is a PLC method using power line transmission, or a wireless method using radio waves. In the wireless method, radio frequency bands such as a 400 MHz band, a 900 MHz band, and a 2.4 GHz band are used depending on each country, and an antenna corresponding to the radio frequencies of each country is incorporated in a case of the electricity meter. In order to perform stable wireless communication, an incorporated antenna having good radiation performance is necessary.

In situations as described above, already several proposals have been made with respect to a method to incorporate the antenna in an electricity meter or a gas meter (see PTL 1 to PTL 3).

FIG. 5 is a view illustrating a conventional example of an electricity meter incorporating an antenna. In FIG. 5, antenna element 112 is disposed in a direction along a wiring direction of power lines 103, 106, and there is one antenna element 112.

However, the conventional proposal has a problem as follows.

A first problem is that a directivity characteristic of antenna radiation is prone to be biased. To the electricity meter, a power supply side power line drawn from an outdoor electric pole and a load side power line drawn into a building are connected. The power lines are made of metal wires, and by influence of the power lines, antenna radiation directivity does not become isotropic, and the radiation direction becomes uneven. By radio waves radiated from the antenna, a high-frequency signal is excited on the power lines, which causes reflection of radio waves. When the antenna is disposed on a front side in the electricity meter, the directivity is to intensely radiate radio waves forward of the electricity meter, and backward, leftward, and rightward radiations are relatively weak.

As a wireless communication mode of the electricity meter, a mesh network is used. That is, data are relayed and transmitted among a plurality of electricity meters, and data are collected to a concentrator (master device). In the mesh network communication, data are successively transferred among the electricity meters. At this time, a relative positional relation between electricity meters cannot be specified. Thus, the antenna is desired to have radiation directivity to be able to receive radio waves in an isotropic manner from the whole circumference. When a direction in which antenna radiation becomes weak occurs, a communication distance in this direction decreases, and communication among the electricity meters becomes unstable or impossible.

A second problem is that an installation location of the electricity meter is in a harsh environment where a multipath phasing occurs. For example, in a case of an apartment house, the electricity meter is installed in a small space, called a pipe shaft, surrounded by concrete walls. Wireless communication between electricity meters is communication through a plurality of concrete walls, which is an environment where large radio wave attenuation and strict multi-path incoming waves are present. Accordingly, due to multi-path phasing, there locally occurs a spot where received electric field intensity drops, and there occur cases where necessary received electric field intensity cannot be obtained. In PTL 2, a diversity antenna method to mount a plurality of antennas so as to avoid local dropping is used. However, because a correlation coefficient of radiation characteristics between antennas is not lowered, sufficient diversity gain is not obtained. Accordingly, it is necessary to differentiate respective radiation characteristics of the antennas, and lower the correlation coefficient of the radiation characteristics, so as to improve the diversity gain.

CITATION LIST

Patent Literatures

PTL 1: Unexamined Japanese Patent Publication No. 2011-81518

PTL 2: Unexamined Japanese Patent Publication No. 2002-109672

PTL 3: Unexamined Japanese Patent Publication No. 2009-253788

SUMMARY OF THE INVENTION

A wireless communication device of the present disclosure, to which an electric power measurement value is input that is measured in an electric power measurer to which a power supply side power line and a load side power line are connected, includes a first antenna element that transmits and receives radio waves and a wireless circuit connected to the first antenna element. The first antenna element has a longitudinal side perpendicular to a line along which the power supply side power line and the load side power line extend With such a configuration, the wireless communication device of the present disclosure can improve a bias of radiation directivity over a whole circumference. Particularly in a mesh network that performs communication between wireless communication devices, more stable communication can be performed.

DESCRIPTION OF EMBODIMENT

Figure 1A:
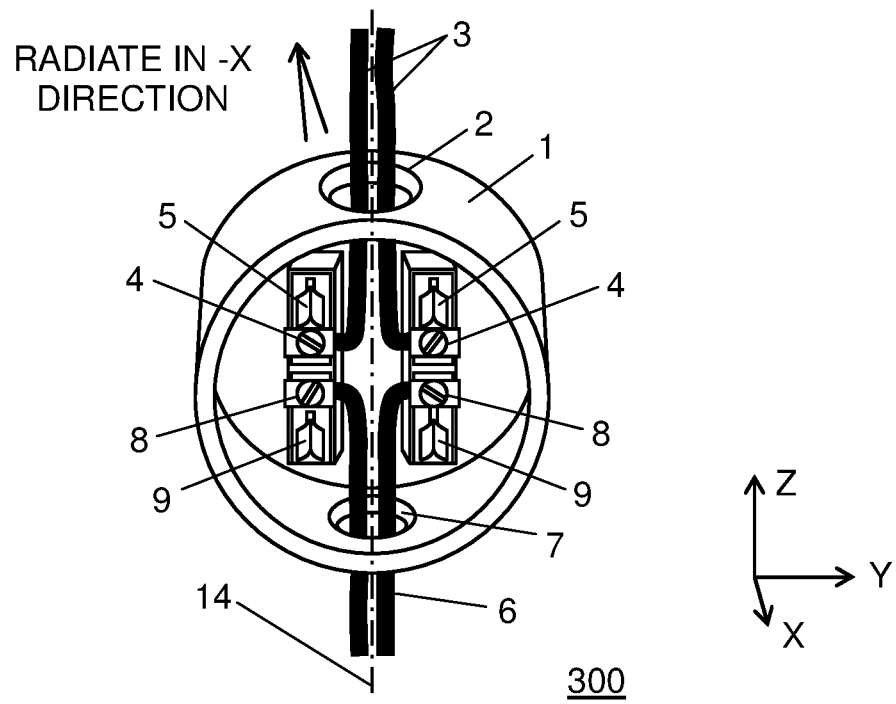
FIG. 1A is an external view illustrating a configuration of an electricity meter including a wireless communication device according to a first exemplary embodiment.

A wireless communication device as a first aspect, to which an electric power measurement value is input that is measured in an electric power measurer to which a power supply side power line and a load side power line are connected, includes a first antenna element that transmits and receives radio waves and a wireless circuit connected to the first antenna element. The first antenna element is disposed so that a longitudinal direction of the first antenna element is orthogonal to an extension direction of wiring directions of the power supply side power line and the load side power line.

With this disposition, because a polarization plane direction of antenna radiation is orthogonal to power lines, radio waves are not reflected by the power lines, and radiation in a rearward direction of a meter can be obtained without being affected by the power lines.

A wireless communication device as a second aspect further includes, in the first aspect, a second antenna element that transmits and receives radio waves, and a wireless circuit is connected to the second antenna element. The second antenna element is disposed so that a longitudinal direction of the second antenna element is orthogonal to the longitudinal direction of the first antenna element.

With this disposition, by having a characteristic that a polarization plane direction of radio waves radiated from the second antenna element is orthogonal to a polarization plane direction of radio waves radiated from the first antenna element, good diversity gain can be improved. Further, while radiation directivity of the first antenna element is to largely radiate toward a rear side of the meter, the second antenna element has a polarization plane direction of radiation in parallel to the power lines. Thus, a high-frequency current in a direction to cancel out radiation flows on the power lines, and radio waves are reflected. Consequently, the radiation directivity of the second antenna element indicates a characteristic that radiation is intense toward a front side direction of the meter. In this manner, the radiation directivity of the first antenna and the radiation directivity of the second antenna are different from each other. That is, a correlation of antenna radiation directivity can be lowered, and diversity gain of a two-branch diversity antenna can be improved further.

In a wireless communication device as a third aspect, in the second aspect, the wireless circuit has a feeding circuit that supplies high-frequency electric power to the first antenna element or the second antenna element. The wireless communication device is configured to further include a switching unit that electrically connects one of the first antenna element and the second antenna element to the feeding circuit, and grounds the other of the first antenna element and the second antenna element.

With this configuration, the grounded antenna element operates as a dummy ground wire. Thus, an electric field is generated between the fed antenna element and the grounded antenna element. Accordingly, the two antenna elements perform operation corresponding to one dipole antenna.

Further, a high-frequency current is concentrated on the two antenna elements, and a high-frequency current to be excited in a circuit pattern on a meter substrate, various types of parts on the meter substrate, and peripheral parts such as a harness wire connected to the meter substrate, becomes small. Accordingly, high-frequency energy is consumed by resistance components such as these peripheral parts, and it is possible to avoid decrease in radiation efficiency of the antennas.

A wireless communication device as a fourth aspect further includes, in the third aspect, an impedance regulator that performs phase correction. The switching unit is configured to electrically connect one of the first antenna element and the second antenna element to the feeding circuit, and to ground the other of the first antenna element and the second antenna element via the impedance regulator.

With this configuration, even when a feeding point of the first antenna element and a feeding point of the second antenna element are slightly separated, the two elements can obtain operation corresponding to one dipole antenna by adjusting a phase relation in the impedance regulator. Thus, a merit that a high-frequency current flowing through a circuit substrate and peripheral parts can be decreased is similar to that of the third aspect.

Hereinafter, exemplary embodiments will be described in detail with reference to the drawings as appropriate. However, descriptions in more detail than necessary may be omitted. For example, detailed descriptions of well-known matters and duplicate descriptions of substantially identical configurations may be omitted. This is to avoid unnecessarily redundancy in the following description, and to facilitate understanding by those skilled in the art.

Note that the attached drawings and the following description are provided for those skilled in the art to fully understand the present disclosure, and are not intended to limit the subject matter as described in the appended claims.

First Exemplary Embodiment

Hereinafter, wireless communication device 200 (see FIG. 3A and FIG. 3B) according to a first exemplary embodiment is exemplified as being mounted in electricity meter (electric power measurement device) 300 (see FIG. 1A, FIG. 1B, and FIG. 2) having an electric power measurer (not illustrated). However, for example, wireless communication device 200 may be mounted in another electronic device such as a wireless fire alarm, a wireless gas leakage alarm, and a handy terminal.

Wireless communication device 200 is disposed in electricity meter 300. Wireless communication device 200 includes at least first antenna element 12 and wireless circuit 17. Note that power supply side power line 3 and load side power line 6 are connected to the electric power measurer. Electric power is measured in the electric power measurer, and an electric power measurement value of the electric power measurer is input to wireless communication device 200.

Further, wireless communication device 200 according to the present exemplary embodiment may also be used in a star-type network to directly communicate with a master device. However, it is desired to form what is called a mesh-type network to perform communication in a bucket-brigade manner between wireless communication devices.

A reason thereof will be described. The mesh network is in a mode of direct communication between a meter and a meter (between a slave device and a slave device), and thus it is not possible to rely on high wireless performance of a master device. In order to reliably establish communication, it is necessary to improve wireless performance of each meter to maximum.

Here, a method for improving the performance will be considered. In the mesh communication, the number of times of communication between wireless communication devices increases. Accordingly, it is unwise to indiscriminately increase wireless transmission output because power consumption increases. Instead of increasing transmission output, it is wise to improve performance of the antenna so as to secure a sufficient communication distance.

Figure 1B:
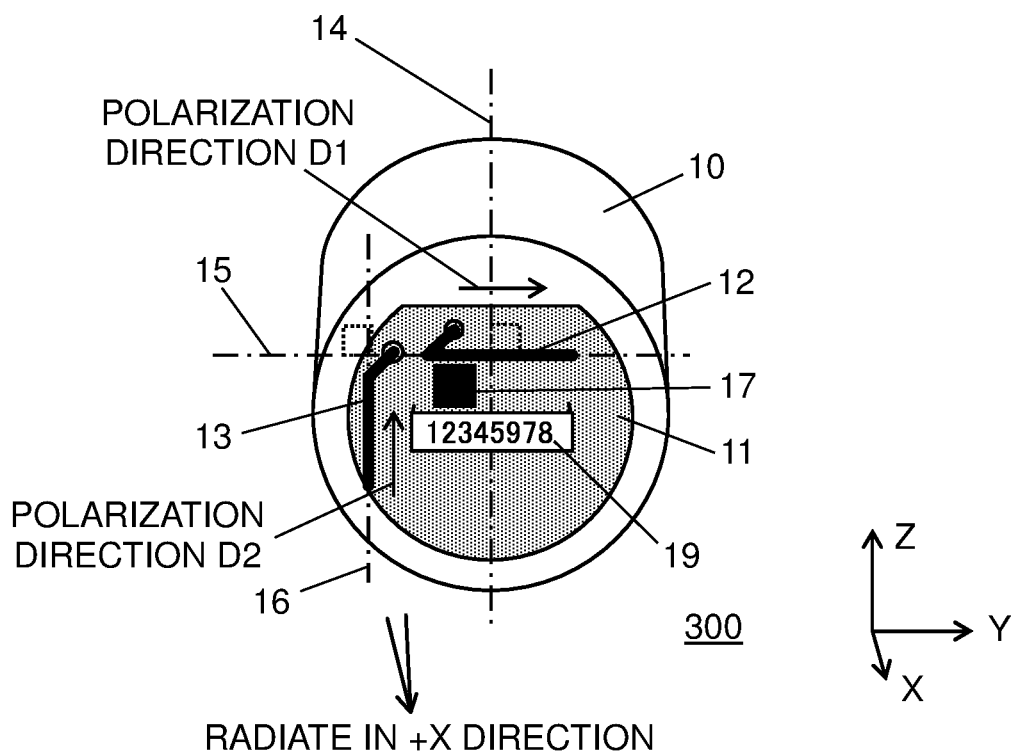
FIG. 1B is an external view illustrating a configuration of the electricity meter including the wireless communication device according to the first exemplary embodiment.

FIG. 1A and FIG. 1B are external views illustrating a configuration of electricity meter 300 including wireless communication device 200 according to the present exemplary embodiment. In FIG. 1A and FIG. 1B, electricity meter 300 includes first case 1, first opening 2, first terminal pair 4, connection electrodes 5, second opening 7, second terminal pair 8, connection electrodes 9, second case 10, meter substrate 11, first antenna element 12, second antenna element 13, wireless circuit 17, and display screen 19. Note that in the present exemplary embodiment, with respect to FIG. 1A and FIG. 1B, the description will be given with an upper side of the figures being an upward direction (Z direction), a front side of the figures being a forward direction (X direction), a rear side of the figures being a rearward direction (−X direction), and a right side of the figures being a Y direction.

The case of electricity meter 300 is constituted of a combination of first case 1 and second case 10.

As illustrated in FIG. 1A, power supply side power line 3 drawn in from an outdoor electric pole is inserted through first opening 2 provided in first case 1. Power supply side power line 3 is connected to first terminal pair 4 provided in first case 1. First terminal pair 4 is connected to connection electrodes 5. Load side power line 6 drawn into a building is inserted through second opening 7 provided in first case 1. Load side power line 6 is connected to second terminal pair 8 provided in first case 1. Second terminal pair 8 is connected to connection electrodes 9.

As illustrated in FIG. 1B, meter substrate 11 is incorporated in second case 10. On meter substrate 11, a measurement circuit (not illustrated) for measuring an amount of electric power and wireless circuit (feeding circuit) 17 are disposed. A high-frequency input and output terminal of wireless circuit (feeding circuit) 17 is connected to first antenna element 12. In the present exemplary embodiment, an inverted-L antenna is used for the antenna element. Further, on meter substrate 11, display screen 19 that displays an electric power measurement value is disposed.

Figure 2:
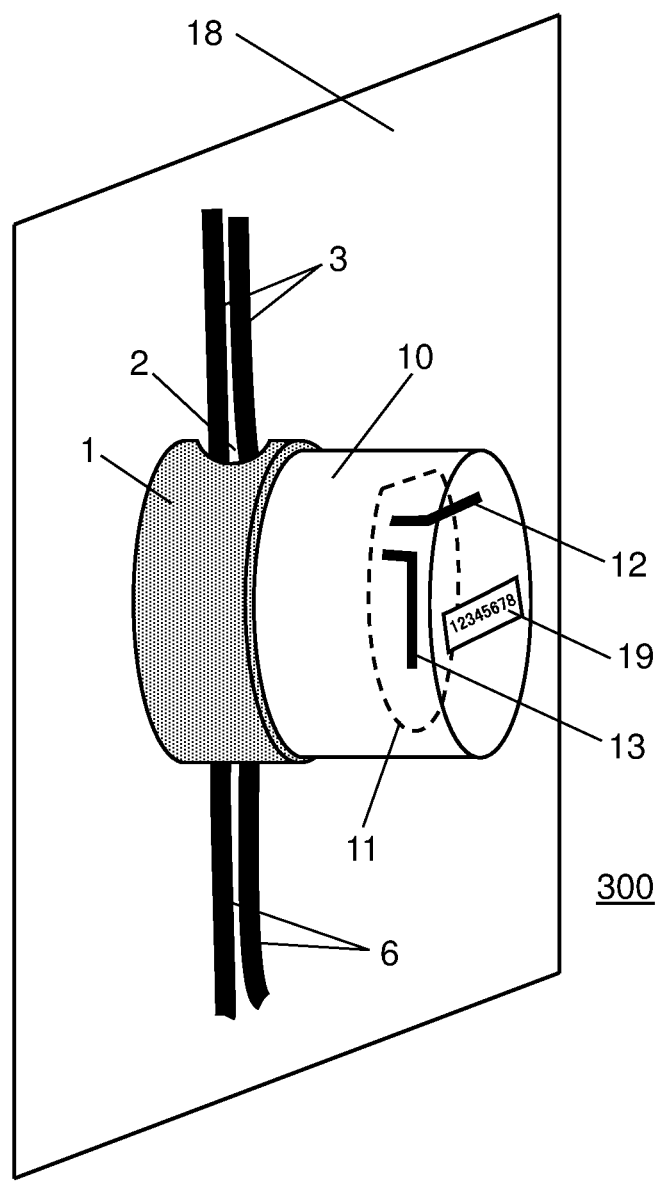
FIG. 2 is a perspective view illustrating an appearance of the electricity meter including the wireless communication device according to the first exemplary embodiment.

FIG. 2 is a perspective view illustrating an appearance of electricity meter 300 including wireless communication device 200 in the first exemplary embodiment. As illustrated in FIG. 2, first case 1 and second case 10 are assembled by stacking on one another at an installation site of electricity meter 300. At this point, connection electrodes 5, 9 of first case 1 illustrated in FIG. 1A are electrically connected in a form of being in contact with connection electrodes (not illustrated) provided on meter substrate 11 of second case 10. In this manner, power supply side power line 3 and load side power line 6 are connected to meter substrate 11. Electricity meter 300 is attached to surface 18 of an attachment wall of a building.

Here, a characteristic structure of electricity meter 300 is in a disposition direction of first antenna element 12 and a disposition relation of first opening 2 and second opening 7 (see FIG. 1A). A position of second opening 7 is chosen at an opposite position (in a direction different by an angle of 180 degrees) to a position of first opening 2 of first case 1. In this manner, in this disposition, an extension direction of a wiring direction of power supply side power line 3 and an extension direction of a wiring direction of load side power line 6 are located on a straight line. This direction is extension direction 14 of the wiring directions of power supply side power line 3 and load side power line 6 illustrated in FIG. 1A and FIG. 1B, which is Z direction in the present exemplary embodiment. On the other hand, first antenna element 12 is disposed so that longitudinal direction 15 of first antenna element 12 is in Y direction orthogonal to Z direction.

By the disposition described above, there is created a characteristic such that first antenna element 12 can radiate radio waves toward a rear side of electricity meter 300. That is, a polarization plane direction of radio waves radiated from first antenna element 12 is Y direction, which is polarization direction D1 illustrated in FIG. 1B. This polarization direction D1 and extension direction 14 of the wiring directions of power supply side power line 3 and load side power line 6 are orthogonal to each other. By this disposition, electromotive force of a high-frequency signal does not occur on power supply side power line 3 and load side power line 6.

A polarization direction of an incoming radio wave, that is, an electric field, is applied in diametrical directions of the power lines. However, because the diametrical directions of power supply side power line 3 and load side power line 6 are quite short as compared to the wiring directions, a spatial potential difference is small, and a high-frequency reverse current excited by power lines is very small. Accordingly, radio waves pass through the power lines and are radiated toward the rear side of electricity meter 300, that is, −X direction. First antenna element 12 can obtain a radiation directivity characteristic close to isotropic.

Further, in the present exemplary embodiment, second antenna element 13 is provided in second case 10. In order to obtain stable wireless communication, it is desirable to use a diversity antenna method to switch antennas so that each of reception and transmission can become optimum. In the present exemplary embodiment, a diversity antenna is constituted by switching first antenna element 12 and second antenna element 13.

Here, as illustrated in FIG. 1B, second antenna element 13 is disposed so that longitudinal direction 16 of second antenna element 13 is in Z direction that is an orthogonal direction to longitudinal direction 15 of first antenna element 12. A polarization direction of radio waves radiated from second antenna element 13 is Z direction, which is polarization direction D2 illustrated in FIG. 1B. Here, polarization directions D1 and D2 are orthogonal, that is, the polarization direction of first antenna element 12 and the polarization direction of second antenna element 13 are orthogonal, by which an effect of polarization diversity antenna can be obtained.

Polarization direction D2 is in parallel to extension direction 14 of the wiring directions of power supply power line 3 and load side power line 6, and a high-frequency reverse current is excited on the power lines. Because radio waves are consequently reflected by the power lines, forward radiation (X direction) of electricity meter 300 becomes intense, and rearward radiation (−X direction) of electricity meter 300 becomes weak. In this manner, a radiation directivity characteristic of first antenna element 12 and a radiation directivity characteristic of second antenna element 13 can be different. Therefore, a correlation coefficient of radiation directivity characteristics between antennas can be made lower, and thus diversity gain can be improved.

In the present exemplary embodiment, the disposition direction of first antenna element 12 and a disposition direction of second antenna element 13 are orthogonal to each other. Further, first opening 2 and second opening 7 are disposed so that the longitudinal direction of first antenna element 12 and the wiring directions of power supply side power line 3 and load side power line 6 are orthogonal to each other. Therefore, there is a merit that strong radiation toward the rear side of electricity meter 300 can be secured, and simultaneously, diversity gain of the diversity antenna can be increased.

Further, the present exemplary embodiment is characterized in a switching circuit of the diversity antenna.

Figure 3A:
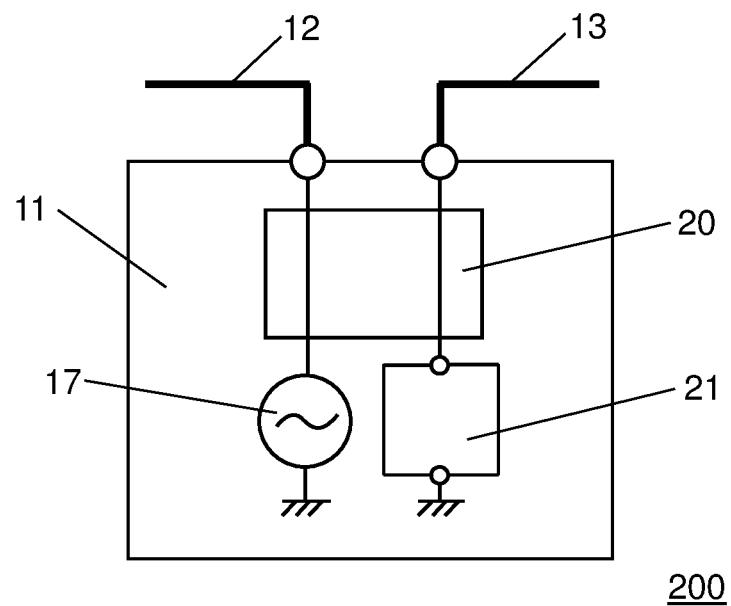
FIG. 3A is a configuration diagram illustrating a configuration of a switching unit which is a component of the first exemplary embodiment.
Figure 3B:
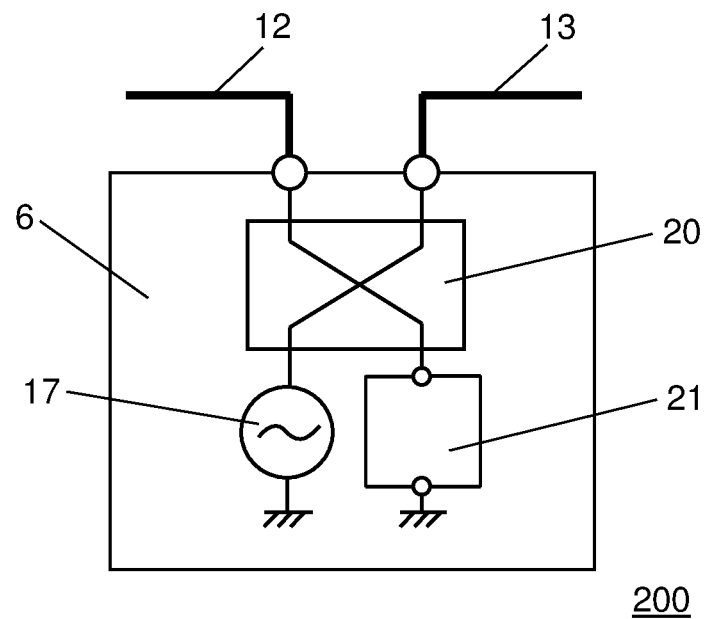
FIG. 3B is a configuration diagram illustrating a configuration of the switching unit which is a component of the first exemplary embodiment.

FIG. 3A and FIG. 3B are diagrams illustrating a configuration of an antenna switching circuit used for the diversity antenna. In FIG. 3A and FIG. 3B, wireless communication device 200 includes first antenna element 12, second antenna element 13, wireless circuit 17, switching unit 20, and impedance regulator 21. However, second antenna element 13, switching unit 20, and impedance regulator 21 are not essential.

Respective one ends of first antenna element 12 and second antenna element 13 are connected to two antenna terminals provided on switching unit 20 configured on meter substrate 11. One of other two terminals provided on switching unit 20 is connected to a high-frequency terminal of wireless circuit 17, and the other is connected to ground of meter substrate 11 via impedance regulator 21. Switching unit 20 switches between a state illustrated in FIG. 3A and a state illustrated in FIG. 3B.

In FIG. 3A, switching unit 20 is in a switched state such that first antenna element 12 is connected to the high-frequency terminal of wireless circuit 17, and second antenna element 13 is connected to the ground of meter substrate 11 via impedance regulator 21. In FIG. 3B, switching unit 20 is in a switched state such that second antenna element 13 is connected to the high-frequency terminal of wireless circuit 17, and first antenna element 12 is connected to the ground of meter substrate 11 via impedance regulator 21.

In the diversity antenna, two antennas are switched one another to perform transmission and reception operations. Here, impedance regulator 21 has a role of setting a load impedance connected to one of the antennas that is not connected to wireless circuit 17.

When one of first antenna element 12 and second antenna element 13 is fed to use the whole antenna as one that operates similarly to a dipole antenna, or when feeding points of the two antenna elements are disposed closely, the other of the antenna elements may be grounded by a direct connection to the ground.

However, in an actual configuration, the feeding points of the two antenna elements are often separated at a certain distance. In this case, the two antennas no longer operate in opposite phases due to a phase delay in a space. Accordingly, by having a phase correction by providing impedance regulator 21, the antenna performance can be ensured.

Figure 4:
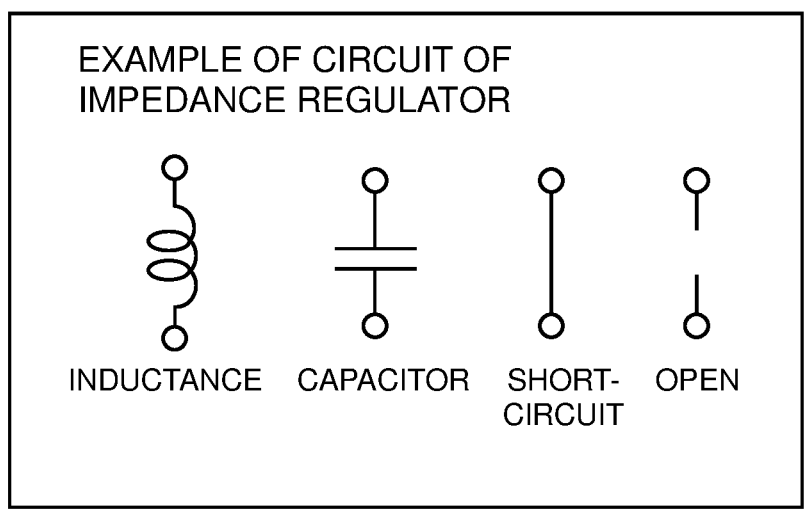
FIG. 4 is a diagram illustrating a circuit example of an impedance regulator in the first exemplary embodiment.
Figure 5:
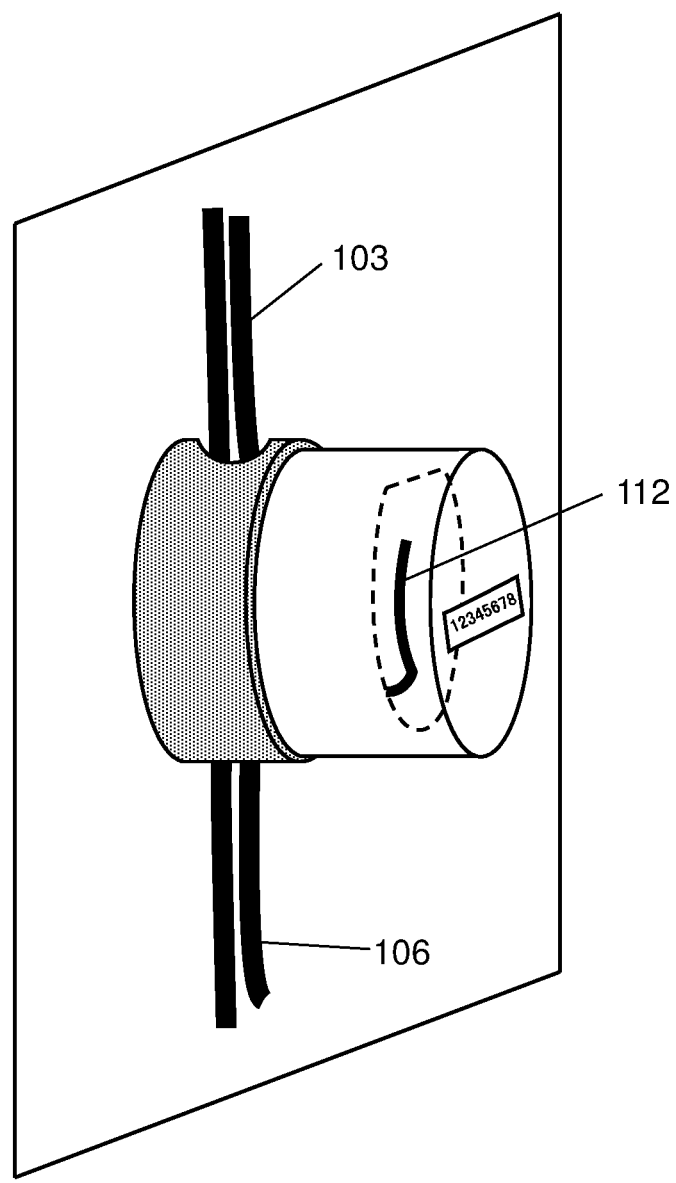
FIG. 5 is a perspective view illustrating an appearance of an electricity meter including a conventional wireless communication device.

FIG. 4 is a diagram illustrating a circuit example of the impedance regulator in the first exemplary embodiment. As illustrated in FIG. 4, as a circuit constant of impedance regulator 21, one of inductance, capacitor, short-circuit, and open can be used. As to which constant is to be used, an optimum constant may be used in consideration of a distance between the antenna elements, a relative angle between the antennas, and influence of a high-frequency current to be excited on a circuit board. A configuration with a variable constant can also be employed and applied with respect to a time of switching the antennas and a change in surrounding environment.

A distance between the feeding point of first antenna element 12 and the feeding point of second antenna element 13 is desirably less than or equal to ¼ or possibly less than or equal to ⅛ of a wavelength of radio waves output from first antenna element 12 or second antenna element 13. By a fact that the feeding points of the two antenna elements are in proximity, use as the antenna that operates similarly to a dipole antenna is more facilitated.

Wireless circuit 17 includes a feeding circuit in the present exemplary embodiment. The feeding circuit is a circuit that supplies high-frequency electric power to first antenna element 12 or second antenna element 13.

Note that in the present exemplary embodiment, although first antenna element 12 and second antenna element 13 are constituted on meter substrate 11, only the antenna elements may be disposed at a position away from the meter substrate. In this case, similarly, it is possible to obtain the effect of radiating radio waves in a rear face direction by providing the openings of the cases so that the longitudinal direction of the antenna elements are orthogonal to the wiring directions of the power lines.

Although the antenna element configuration is the inverted-L antenna, any antenna element configuration such as an inverted-F antenna or a patch antenna may be employed. In this case, first antenna element 12 is designed such that the polarization plane direction of radio waves radiated from first antenna element 12 and the wiring directions of the power lines are orthogonal to each other. The wireless communication device is designed such that a polarization plane direction of radio waves radiated from second antenna element 13 and the polarization plane direction of radio waves radiated by first antenna element 12 are orthogonal to each other, and the polarization plane direction of radio waves radiated from second antenna element 13 is in parallel to the wiring directions of the power lines.

First antenna element 12 is disposed at a position close to power supply side power line 3 or load side power line 6 on meter substrate 11. Specifically, a distance between one power line out of power supply side power line 3 and load side power line 6 and first antenna element 12 is desirably less than or equal to ½, or possibly less than or equal to ¼, of the wavelength. By disposing at a close position, radio waves radiated from first antenna element 12 can increase intensity of radio waves radiated rearward from the electricity meter.

The antenna configuration of the wireless communication device according to the present exemplary embodiment is effective when the wireless communication device is used for a mesh network to perform direct communication between terminals. That is, in the mesh network, a direction of another wireless communication device to communicate with cannot be recognized. Thus, it is desirable to radiate radio waves with isotropic directivity in a whole circumferential direction. In the present exemplary embodiment, radiation in a rear face direction by passing through the power lines can be obtained. In this manner, radiation directivity that is isotropic to the whole circumferential direction can be given.

As a specific radio frequency of the wireless communication device, it is effective to apply a frequency near a sub-GHz band, that is, 900 MHz. A wavelength corresponding to 900 MHz is about 32 cm, and when a length of the antenna element is around ¼ of the wavelength, a large resonance is obtained and characteristics become favorable. A quarter of the wavelength is about 8 cm, which is generally a slightly smaller dimension than an external dimension (diameter of 10 cm to 15 cm) of first case 1 and second case 10. Therefore, it is possible to incorporate an antenna element having good radiation efficiency around 8 cm. On the other hand, when the frequency is further higher, the antenna element is reduced in size, and incorporation of the antenna element is easy. However, as a negative effect, a distance of viewing a distance between the antenna element and the power lines in a wavelength scale is large. In this case, reflection on the power lines becomes relatively large, and the effect of obtaining radiation in a rearward direction (−X direction) of the case becomes slightly smaller. The antenna element exhibits a directivity characteristic that radiation in the forward direction (X direction) of the case becomes strong. As described above, a frequency around 900 MHz is favorable as the radio frequency, and when the frequency is higher or lower than this frequency, there is shown a tendency that the effect is slightly limited.

Further, in the present exemplary embodiment, the first antenna element is disposed so that the longitudinal direction of the first antenna element is orthogonal to the power lines. However, the first antenna element may be disposed with a certain inclination at an angle other than 90 degrees. Specifically, even when the first antenna element is displaced by about ±20 degrees from 90 degrees, a sufficient effect can be obtained. That is, in the present exemplary embodiment, to be orthogonal is not limited to a state of crossing at 90 degrees, and includes crossing in a range of 70 degrees to 110 degrees.

As a mode of installation, even when power supply side power line 3 or load side power line 6 is accommodated in a metal pipe, this configuration can be applied. Specifically, first opening 2 and second opening 7 only need to be provided so that longitudinal direction 15 of first antenna element 12 is orthogonal to a disposition direction of a metal pipe.

Further, this configuration can be applied even when first opening 2 and second opening 7 are not disposed at positions in an opposite direction (at 180 degrees) of first case 1 from each other. For example, a case will be considered that first opening 2 and second opening 7 are disposed in a direction at 90 degrees of first case 1 from each other. In this case, first antenna element 12 is disposed so that the disposition direction of the power line passing through the opening near first antenna element 12 is orthogonal to the longitudinal direction of first antenna element 12. By such a disposition, a characteristic to radiate toward the rear side of the electricity meter can be obtained. Note that the above-described direction is not limited to 90 degrees, and even when being disposed in any direction, it can be similarly applied.

Further, when first opening 2 and second opening 7 are provided in the same direction (at 0 degrees) as that of first case 1, or when a configuration that both the power supply side power line and the load side power line are inserted through first opening 2 is employed, first antenna element 12 may be disposed so that a disposition direction of first antenna element 12 is orthogonal to the wiring directions of the power lines passing through the opening.

INDUSTRIAL APPLICABILITY

As described above, a wireless communication device according to the present disclosure is applied to an electric power meter to which power lines are connected. With a polarization plane direction of antenna radiation of an internal antenna being orthogonal to wiring directions of power lines, radio waves are not reflected by the power lines, radiation in a rearward direction of a meter can be obtained, and isotropy of radiation directivity can be improved.

REFERENCE MARKS IN THE DRAWINGS

1: first case
2: first opening
3: power supply side power line
4: first terminal pair
5: connection electrode
6: load side power line
7: second opening
8: second terminal pair
9: connection electrode
10: second case
11: meter substrate
12: first antenna element
13: second antenna element
17: wireless circuit (feeding circuit)
20: switching unit
21: impedance regulator
200: wireless communication device

The invention claimed is:
1. An electric power measurement device comprising:
an electric power measurer, to which a power supply side power line and a load side power line are connected and which is configured to measure an electric power measurement value; and
a wireless communication device to which the electric power measurement value is input,
wherein the wireless communication device comprises:
a first antenna element configured to transmit and receive radio waves; and
a wireless circuit connected to the first antenna element,
the first antenna element has a longitudinal side perpendicular to an extension direction of the power supply side power line and the load side power line, and
the first antenna element is disposed with a distance to one of the power supply side power line and the load side power line less than or equal to ½ of wavelength of the radio frequency of the wireless communication device.
2. The electric power measurement device according to claim 1, wherein:
the wireless communication device further comprises a second antenna element configured to transmit and receive radio waves,
the wireless circuit is connected to the second antenna element, and
the second antenna element has a longitudinal side perpendicular to the longitudinal side of first antenna element.
3. The electric power measurement device according to claim 2, wherein:

the wireless circuit has a feeding circuit configured to supply high-frequency electric power to the first antenna element or the second antenna element, and the wireless communication device further comprises a switching unit configured to electrically connect one of the first antenna element and the second antenna element to the feeding circuit, and grounds the other of the first antenna element and the second antenna element.

4. The electric power measurement device according to claim 3, wherein:

the wireless communication device further comprises an impedance regulator configured to perform phase correction, and the switching unit is configured to electrically connect one of the first antenna element and the second antenna element to the feeding circuit, and to ground the other of the first antenna element and the second antenna element via the impedance regulator.

* * * * *